United States Patent
Kado et al.

(10) Patent No.: US 10,032,499 B2
(45) Date of Patent: Jul. 24, 2018

(54) MAGNETIC MEMORY DEVICE INCLUDING TWO MAGNETIC BODIES

(71) Applicant: TOSHIBA MEMORY CORPORATION, Tokyo (JP)

(72) Inventors: Masaki Kado, Kanagawa (JP); Tsuyoshi Kondo, Kanagawa (JP); Hirofumi Morise, Kangawa (JP); Yasuaki Ootera, Kanagawa (JP); Takuya Shimada, Kanagawa (JP); Michael Arnaud Quinsat, Kanagawa (JP); Shiho Nakamura, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/267,418

(22) Filed: Sep. 16, 2016

(65) Prior Publication Data
US 2017/0229640 A1    Aug. 10, 2017

(30) Foreign Application Priority Data
Feb. 10, 2016    (JP) .................................. 2016-023360

(51) Int. Cl.
G11C 11/16    (2006.01)
G11C 19/08    (2006.01)

(52) U.S. Cl.
CPC ...... *G11C 11/1675* (2013.01); *G11C 19/0841* (2013.01)

(58) Field of Classification Search
None
See application file for complete search history.

(56) References Cited

U.S. PATENT DOCUMENTS

| | | | | |
|---|---|---|---|---|
| 7,307,876 | B2* | 12/2007 | Kent | B82Y 10/00 |
| | | | | 257/E43.004 |
| 9,515,123 | B2* | 12/2016 | Nakamura | H01L 27/222 |
| 2002/0186582 | A1* | 12/2002 | Sharma | B82Y 25/00 |
| | | | | 365/158 |
| 2008/0025060 | A1* | 1/2008 | Lim | G11C 11/14 |
| | | | | 365/86 |
| 2009/0135526 | A1* | 5/2009 | Dieny | H01L 43/08 |
| | | | | 360/314 |
| 2010/0054026 | A1* | 3/2010 | Xi | G11C 11/16 |
| | | | | 365/158 |
| 2013/0235653 | A1 | 9/2013 | Kondo et al. | |
| 2014/0126280 | A1 | 5/2014 | Annunziata et al. | |

(Continued)

FOREIGN PATENT DOCUMENTS

JP    2013-187257    9/2013
JP    2016-9805    1/2016

OTHER PUBLICATIONS

O'Brien, L. et al., "Tunable Remote Pinning of Domain Walls in Magnetic Nanowires", Physical Review Letters, PRL 106, 087204-1-4, American Physical Society, (2011).

*Primary Examiner* — Andres Munoz
(74) *Attorney, Agent, or Firm* — Finnegan, Henderson, Farabow, Garrett & Dunner, L.L.P.

(57) ABSTRACT

According to one embodiment, a magnetic memory device includes a first magnetic body and a second magnetic body. The first magnetic body extends in a first direction. The second magnetic body extends in the first direction. A distance between the second magnetic body and the first magnetic body changes periodically along the first direction.

16 Claims, 7 Drawing Sheets

(56) References Cited

U.S. PATENT DOCUMENTS

2014/0204487 A1* 7/2014 Hase ............... H01L 43/08
                                                                                     360/244
2015/0380638 A1   12/2015 Ootera et al.

* cited by examiner

US 10,032,499 B2

MAGNETIC MEMORY DEVICE INCLUDING TWO MAGNETIC BODIES

CROSS-REFERENCE TO RELATED APPLICATIONS

This application is based upon and claims the benefit of priority from Japanese Patent Application No. 2016-023360, filed on Feb. 10, 2016; the entire contents of which are incorporated herein by reference.

FIELD

Embodiments of the invention relate generally to a magnetic memory device.

BACKGROUND

A magnetic memory device has been proposed in which Information recorded in a magnetic wire is moved by moving domain walls. It is desirable to increase the bit density of the magnetic memory device.

DETAILED DESCRIPTION

Figures 1A, 1B:
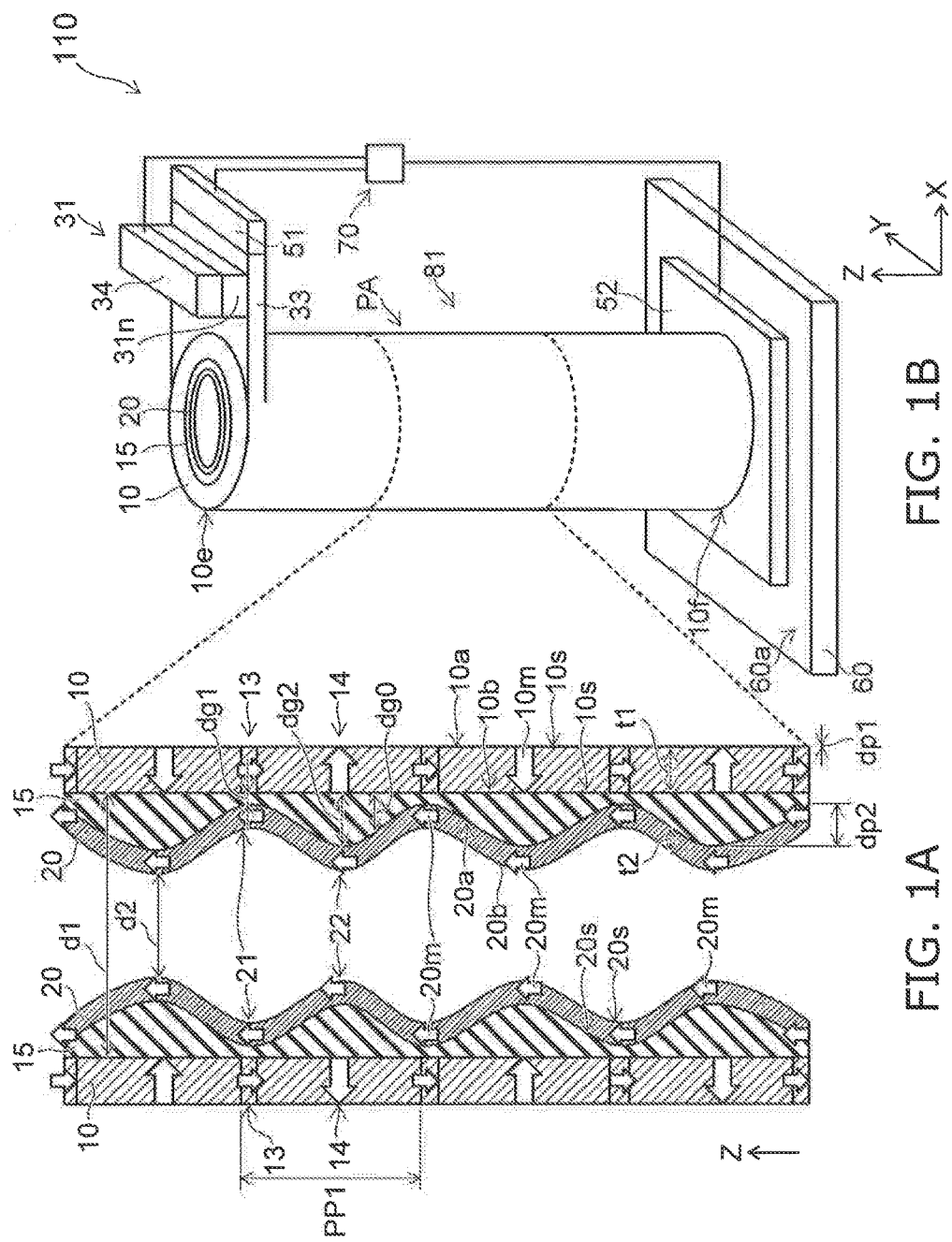
FIG. 1A and FIG. 1B are schematic views illustrating a magnetic memory device according to a first embodiment.

According to one embodiment, a magnetic memory device includes a first magnetic body and a second magnetic body. The first magnetic body extends in a first direction. The second magnetic body extends in the first direction. A distance between the second magnetic body and the first magnetic body changes periodically along the first direction.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately. In this specification, the state of being "provided on" includes not only the state of being provided in direct contact, but also the state of being provided with another component Interposed in between.

(First Embodiment)

FIG. 1A and FIG. 1B are schematic views illustrating a magnetic memory device according to a first embodiment.

FIG. 1B is a perspective view. FIG. 1A is a cross-sectional view of a portion of FIG. 1B.

As shown in FIG. 1B, the magnetic memory device 110 according to the embodiment includes a first magnetic body 10 and a second magnetic body 20. These magnetic bodies are, for example, magnetic layers.

The first magnetic body 10 extends in a first direction. The second magnetic body 20 also extends in the first direction.

The first direction is taken as a Z-axis direction. One direction perpendicular to the Z-axis direction is taken as an X-axis direction. A direction perpendicular to the Z-axis direction and the X-axis direction is taken as a Y-axis direction.

An insulating layer 15 is further provided in the example. The insulating layer 15 is provided between the first magnetic body 10 and the second magnetic body 20. The first magnetic body 10 is conductive. The second magnetic body 20 is conductive or insulative. In the case where the second magnetic body 20 is conductive, the insulating layer 15 insulates the second magnetic body 20 from the first magnetic body 10.

A first electrode 51, a second electrode 52, and a controller 70 are provided in the magnetic memory device 110. The first magnetic body 10 has a first end 10e and a second end 10f. The second end 10f is arranged with the first end 10e in the Z-axis direction (the first direction). The first electrode 51 is electrically connected to the first end 10e. The second electrode 52 is electrically connected to the second end 10f. The first magnetic body 10, the first electrode 51, and the second electrode 52 are included in one memory unit 81.

The controller 70 is electrically connected to the first electrode 51 and the second electrode 52. The controller 70 supplies a current to the first magnetic body 10 via the first electrode 51 and the second electrode 52. Due to the current, the magnetization (a first magnetization 10m) of the first magnetic body 10 moves along the Z-axis direction.

FIG. 1A is a cross-sectional view of a plane including the Z-axis direction. In the embodiment as shown in FIG. 1A, a distance dg0 between the second magnetic body 20 and the first magnetic body 10 changes periodically along the Z-axis direction (the first direction).

For example, the second magnetic body 20 includes multiple first regions 21 and multiple second regions 22. These regions are arranged alternately along the Z-axis direction. For example, the positions in the Z-axis direction (the first direction) of the second regions 22 are different from the positions in the first direction of the first regions 21.

The first magnetic body 10 includes multiple third regions 13 and multiple fourth regions 14. These regions are arranged alternately along the Z-axis direction. The third regions 13 overlap the first regions 21 inside the X-Y plane (a plane orthogonal to the Z-axis direction). The fourth regions 14 overlap the second regions 22 inside the X-Y plane (the plane orthogonal to the Z-axis direction).

A first distance dg1 between the first region 21 and the third region 13 is shorter than a second distance dg2 between the second region 22 and the fourth region 14. Such a first distance dg1 and such a second distance dg2 are arranged alternately along the Z-axis direction.

In the example, the first magnetic body 10 surrounds the periphery of the second magnetic body 20. The first magnetic body 10 has a tubular configuration extending in the Z-axis direction (the first direction). The second magnetic body 20 has a tubular configuration extending in the Z-axis direction (the first direction).

A diameter d2 of the second magnetic body 20 is smaller than a diameter d1 of the first magnetic body 10. In the example, the diameter d1 of the first magnetic body 10 is substantially uniform. On the other hand, the diameter d2 of the second magnetic body 20 changes periodically along the first direction.

For example, the first magnetic body 10 has an easy magnetization axis along a direction crossing the Z-axis direction (the first direction). The first magnetization 10m of at least a portion of the first magnetic body 10 has a component crossing the Z-axis direction. The first magnetic body 10 is, for example, a perpendicular magnetization film.

For example, the first magnetization 10m is oriented toward the inner side of the tube in a first state. The first magnetization 10m is oriented toward the outer side of the tube in a second state. These two states correspond to the Information that is recorded. The first magnetic body 10 corresponds to a memory layer. Due to the current, the information that is recorded moves along the Z-axis direction in the first magnetic body 10.

For example, the second magnetic body 20 has an easy magnetization axis having a component along the Z-axis direction (the first direction). The magnetization (a second magnetization 20m) of the second magnetic body 20 has a component along the Z-axis direction. The second magnetic body 20 is, for example, an in-plane magnetization film.

In the third region 13 of the first magnetic body 10, the distance (the first distance dg1) between the first magnetic body 10 and the second magnetic body 20 is short. The third region 13 of the first magnetic body 10 is affected by the second magnetic body 20. For example, the magnetization in the third region 13 is antiparallel to the second magnetization 20m of the second magnetic body 20. For example, the third region 13 corresponds to a domain wall of the first magnetic body 10.

On the other hand, in the fourth region 14 of the first magnetic body 10, the distance (the second distance dg2) between the first magnetic body 10 and the second magnetic body 20 is long. The effects of the second magnetic body 20 are small in the fourth region 14 of the first magnetic body 10. For example, the magnetization in the fourth region 14 is aligned with the inward direction of the tube or the outward direction of the tube. For example, the fourth region 14 corresponds to a magnetic domain of the first magnetic body 10.

When the current is supplied to the first magnetic body 10, the first magnetizations 10m of the first magnetic body 10 move discretely to the positions of the multiple fourth regions 14.

In the embodiment, modulation of the potential of the first magnetic body 10 is caused by a static magnetic field from the second magnetic body 20. Thereby, the stability of the movement of the domain walls of the first magnetic body 10 increases. For example, the stability of the movement of the magnetic domains of the first magnetic body 10 increases.

For example, there is a first reference example in which the first magnetic body 10 is provided without providing the second magnetic body 20. In the reference example, it is difficult to obtain stable movement of the domain walls. On the other hand, there is a second reference example in which the thickness of the first magnetic body 10 changes periodically. In the reference example, it is relatively difficult for the thickness to change periodically and uniformly.

In the embodiment, the second magnetic body 20 is provided in addition to the first magnetic body 10. The distance dg0 between the two magnetic bodies changes periodically. The magnetic interaction between these magnetic bodies is utilized in the regions where the distance dg0 is short. Thereby, the stability of the movement of the domain walls increases. In this configuration, the thickness of the first magnetic body 10 may not change. For example, the range of the manufacturing conditions can be enlarged. Even in the case where the element is downscaled and the bit density is increased, stable operations are obtained. According to the embodiment, a magnetic memory device can be provided in which the bit density can be increased.

In the magnetic memory device 110, the side surface of the first magnetic body 10 has a tubular configuration; and the position in the X-Y plane of the side surface of the second magnetic body changes periodically along the first direction.

For example, the first magnetic body 10 has a first side surface 10s. The first side surface 10s crosses a second direction that is perpendicular to the first direction. The second direction is any direction in the X-Y plane. The first magnetic body 10 has a first outer side surface 10a and a first Inner side surface 10b. The first side surface 10s is the first outer side surface 10a or the first inner side surface 10b. In the example, the first side surface 10s has a tubular configuration extending in the first direction. The position along the second direction of the first side surface 10s substantially does not change. The fluctuation range (a first fluctuation range dp1) along the Z-axis direction (the first direction) of the position in the second direction of the first side surface 10s is small.

On the other hand, the second magnetic body 20 has a second side surface 20s. The second side surface 20s crosses the second direction (any direction in the X-Y plane) recited above. The second magnetic body 20 has a second outer side surface 20a and a second Inner side surface 20b. The second side surface 20s is the second outer side surface 20a or the second inner side surface 20b. The position along the second direction of the second side surface 20s changes greatly. The fluctuation range (a second fluctuation range dp2) along the Z-axis direction (the first direction) of the position in the second direction of the second side surface 20s is large. The first fluctuation range dp1 is smaller than the second fluctuation range dp2.

For example, a first thickness t1 (the thickness along the second direction) of the first magnetic body 10 is substantially constant. Thereby, the movement of the domain walls inside the first magnetic body 10 is easily performed uniformly.

In the embodiment, for example, the width (the length along the first direction) of the third region 13 is shorter than the width (the length along the first direction) of the fourth region 14.

As described above, the distance dg0 between the second magnetic body 20 and the first magnetic body 10 changes periodically along the first direction. A period pp1 is the period of the change of the distance dg0.

In the embodiment, for example, the distance dg0 between the second magnetic body 20 and the first magnetic body 10 at the positions where the distance dg0 is short is smaller than the period pp1.

The first distance dg1 between the first region 21 and the third region 13 is shorter than the second distance dg2 between the second region 22 and the fourth region 14. The first distance dg1 is the distance along the second direction (a direction perpendicular to the first direction) between the first region 21 and the first magnetic body 10. The second distance dg2 is the distance along the second direction between the second region 22 and the first magnetic body 10. The first distance dg1 is shorter than the second distance dg2. The first distance dg1 is shorter than the period pp1 (the period of the change of the distance dg0 between the second magnetic body and the first magnetic body 10). By setting the first distance dg1 to be sufficiently smaller than the period pp1, the second magnetic body 20 can act effectively on the first magnetic body 10.

In the embodiment, the first distance dg1 is, for example, ⅕ of the period pp1 or less. The first distance dg1 may be, for example, 1/10 of the period pp1 or less. High controllability of the domain walls (the magnetic domains) is obtained.

In the embodiment, the second distance dg2 is 2 times the first distance dg1 or more. The second distance dg2 may be 4 times the first distance dg1 or more. High controllability of the domain walls (the magnetic domains) is obtained.

In the embodiment, the first thickness t1 (the thickness along the second direction) of the first magnetic body 10 is, for example, not less than 0.3 nm and not more than 15 nm. A second thickness t2 (the thickness along the second direction) of the second magnetic body 20 is, for example, not less than 0.3 nm and not more than 30 nm.

As shown in FIG. 1B, the magnetic memory device 110 further includes a third magnetic body 33, a fourth magnetic body 34, and a first Intermediate layer 31n. For example, the third magnetic body 33 is continuous with the first magnetic body 10. The first intermediate layer 31n is provided between the third magnetic body 33 and the fourth magnetic body 34. For example, the fourth magnetic body 34 and the first intermediate layer 31n are used as a first recording/reproducing unit 31. The controller 70 is electrically connected to the fourth magnetic body 34.

In the example, the third magnetic body 33 includes a portion not overlapping the first magnetic body 10 in the first direction. The fourth magnetic body 34 does not overlap the first magnetic body 10 in the first direction.

For example, the magnetization of the third magnetic body 33 changes according to the magnetization of the first magnetic body 10. For example, the third magnetic body 33 is connected to the first end 10e of the first magnetic body 10. In such a case, the magnetization of the third magnetic body 33 corresponds to the magnetization at the first end 10e of the first magnetic body 10.

The magnetization of the fourth magnetic body 34 is substantially fixed. For example, the electrical resistance between the fourth magnetic body 34 and the first magnetic body 10 changes according to the angle between the magnetization of the third magnetic body 33 and the magnetization of the fourth magnetic body 34. For example, the magnetization of the third magnetic body 33 (i.e., the first magnetization 10m at the first end 10e of the first magnetic body 10) is sensed using the current flowing between the fourth magnetic body 34 and the second electrode 52. Thereby, the information (the magnetizations) that is recorded in the first magnetic body 10 is sensed. Thereby, a reproduction operation is performed.

On the other hand, the control of the first magnetization 10m of the first magnetic body 10 may be performed by, for example, the fourth magnetic body 34, the first electrode 51, etc. In other words, a recording operation is performed.

A substrate 60 may be provided as shown in FIG. 1B. The substrate 60 has a surface 60a (e.g., a major surface). For example, the surface 60a is substantially perpendicular to the Z-axis direction. The first magnetic body 10 and the second magnetic body 20 are provided on the surface 60a. These magnetic bodies extend perpendicularly to the surface 60a.

An example of a method for manufacturing the magnetic memory device 110 will now be described.

FIG. 2A to FIG. 2F are schematic cross-sectional views in order of the processes, illustrating the method for manufacturing the magnetic memory device according to the first embodiment.

Figure 2A:
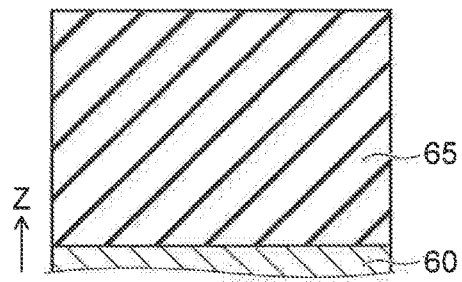
FIG. 2A to FIG. 2F are schematic cross-sectional views in order of the processes, illustrating the method for manufacturing the magnetic memory device according to the first embodiment.

As shown in FIG. 2A, a foundation layer 65 is formed on the substrate 60. For example, the foundation layer 65 is nonmagnetic. The foundation layer 65 includes, for example, silicon oxide, etc.

Figure 2B:
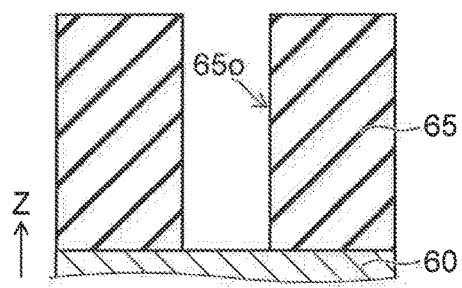

As shown in FIG. 2B, a hole 65o is formed in the foundation layer 65. The direction in which the hole 65o extends corresponds to the Z-axis direction.

Figure 2C:
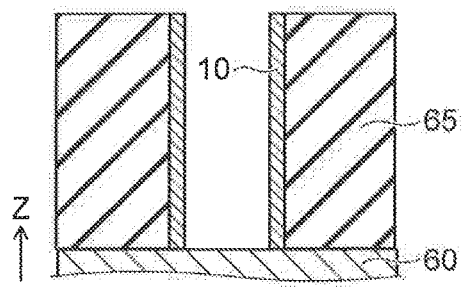

As shown in FIG. 2C, a magnetic film that is used to form the first magnetic body 10 is formed on the inner wall of the hole 65o. The first magnetic body 10 has a tubular configuration.

Figure 2D:
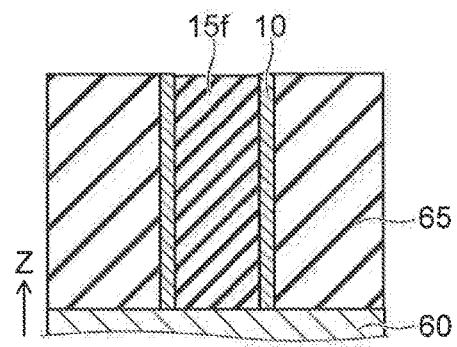

As shown in FIG. 2D, a film 15f is formed in the remaining space of the hole 65o.

Figure 2E:
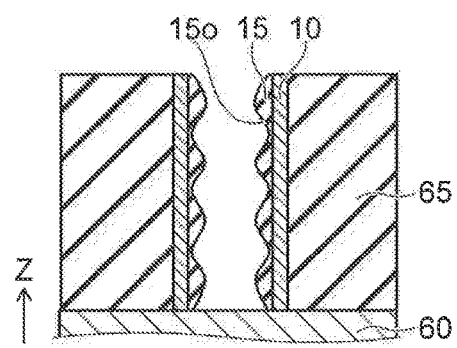

As shown in FIG. 2E, a hole 15o is formed in the film 15f. The diameter of the hole 15o changes periodically along the Z-axis direction. For example, as the film 15f, a stacked film is formed by alternately stacking multiple films having different etching rates. The hole 15o is formed by etching the stacked film. The diameter of the hole 15o changes periodically according to the difference between the etching rates. For example, the hole 15o in which the diameter changes periodically may be formed by a Bosch process. Also, anodic oxidation may be performed; and the voltage at that time may be changed periodically. Thereby, the hole 15o in which the diameter changes periodically along the Z-axis direction is obtained. The insulating layer 15 is obtained by these methods.

Figure 2F:
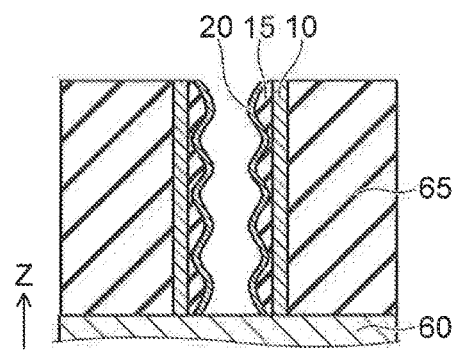

As shown in FIG. 2F, a magnetic film that is used to form the second magnetic body 20 is formed on the surface of the insulating layer 15.

In the formation of the first magnetic body 10 recited above, for example, a perpendicular magnetization metal film is obtained by forming a stacked film of a Pt film and a Co film. For example, the stacked film is formed by CVD (Chemical Vapor Deposition). The perpendicular magnetization metal film is used to form the first magnetic body 10.

In the formation of the second magnetic body 20 recited above, for example, an in-plane magnetization film is obtained by forming a Co film. For example, the Co film is formed by CVD. The in-plane magnetization film is used to form the second magnetic body 20.

The first electrode 51, the second electrode 52, the third magnetic body 33, the fourth magnetic body 34, and the first intermediate layer 31n are formed appropriately. Thereby, the magnetic memory device 110 is obtained.

In the embodiment, the first magnetic body 10 includes, for example, an alloy. The alloy includes a first element and at least one of Co or Fe. The first element includes at least one of Ni, Pt, Ph, Pd, Gd, Tb, Dy, Ho, Er, Tm, Yb, Lu, O, B, Ga, Ge, Si, Al, Mn, Mg, Zr, or Hf. The first magnetic body 10 may include, for example, a first film that includes at least one of Co or Fe, and a second film that includes the first element recited above stacked with the first film.

Figure 3A:
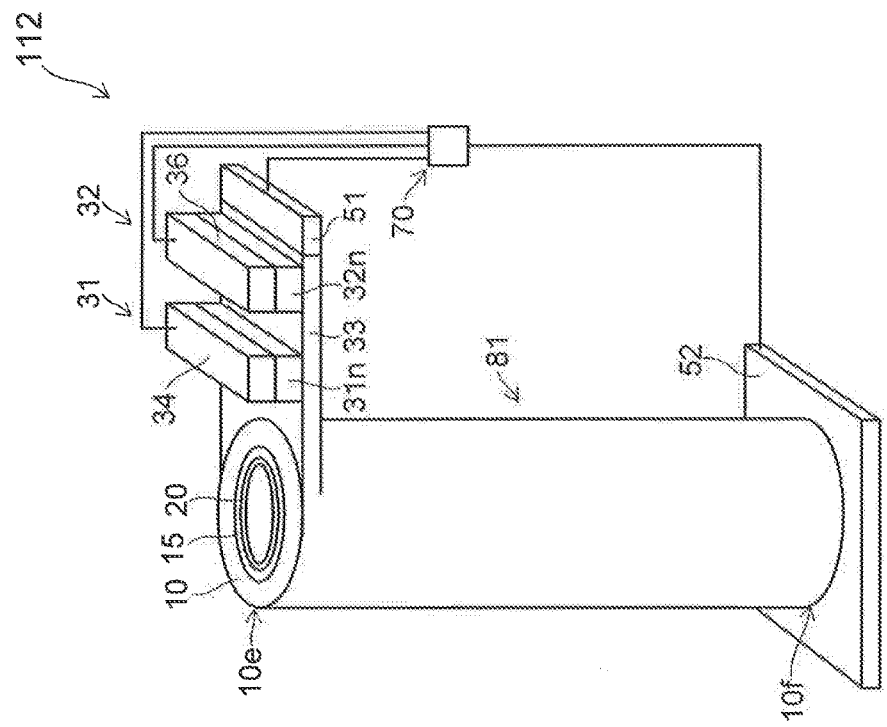
FIG. 3A and FIG. 3B are schematic perspective views illustrating other magnetic memory devices according to the first embodiment.
Figure 3B:
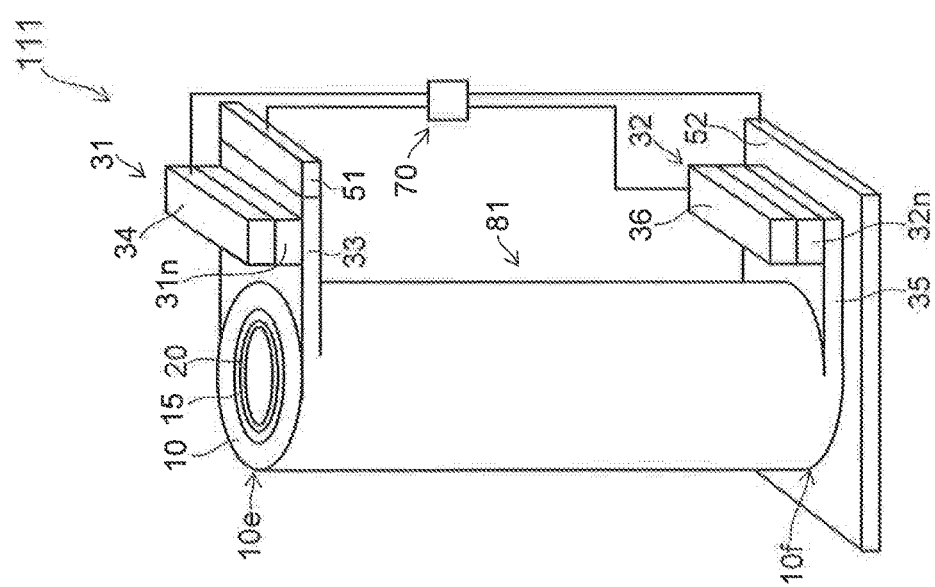

FIG. 3A and FIG. 3B are schematic perspective views illustrating other magnetic memory devices according to the first embodiment.

As shown in FIG. 3A and FIG. 3B, the first magnetic body and the second magnetic body 20 are provided in the other magnetic memory devices 111 and 112 according to the embodiment as well. The first electrode 51, the second electrode 52, the controller 70, the third magnetic body 33, the fourth magnetic body 34, and the first intermediate layer 31n are further provided. These are similar to those of the magnetic memory device 110; and a description is omitted.

A fifth magnetic body 35, a sixth magnetic body 36, and a second intermediate layer 32n are further provided in the magnetic memory device 111. The fifth magnetic body 35 is continuous with the first magnetic body 10. In the example, the fifth magnetic body 35 is continuous with the second end 10f of the first magnetic body 10. The second intermediate layer 32n is provided between the fifth magnetic body 35 and the sixth magnetic body 36. The sixth magnetic body 36 and the second Intermediate layer 32n are used as a second recording/reproducing unit 32.

The sixth magnetic body 36 and the second intermediate layer 32n are further provided in the magnetic memory device 112. The second intermediate layer 32n is provided between the third magnetic body 33 and the sixth magnetic body 36. The sixth magnetic body 36 and the second intermediate layer 32n are used as the second recording/reproducing unit 32.

For example, the magnetization of the sixth magnetic body 36 is substantially fixed. Thus, the first recording/reproducing unit 31 and the second recording/reproducing unit 32 are provided in the magnetic memory devices 111 and 112. The recording operation and the reproduction operation may be performed by these recording/reproducing units. The recording operation may be performed by one of these recording/reproducing units; and the reproduction operation may be performed by the other of these recording/reproducing units. The substrate 60 may be further provided in the magnetic memory devices 111 and 112. In the magnetic memory devices 111 and 112 as well, the bit density can be increased.

Figure 4:
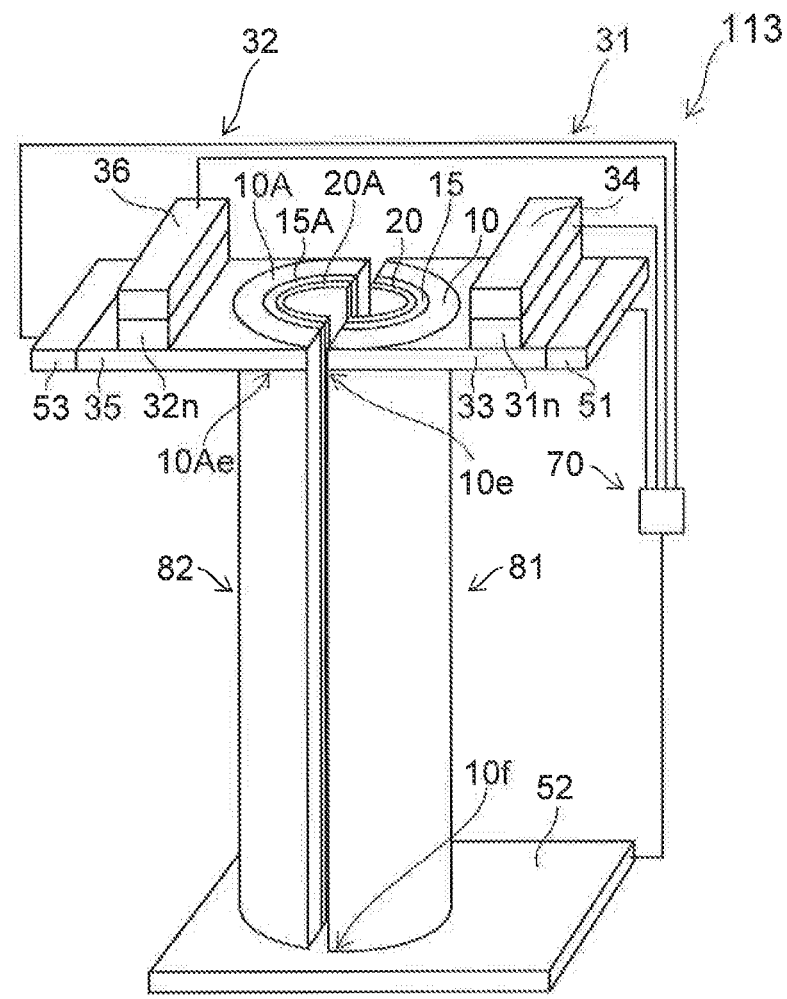
FIG. 4 is a schematic perspective view illustrating another magnetic memory device according to the first embodiment.

FIG. 4 is a schematic perspective view illustrating another magnetic memory device according to the first embodiment.

In the other magnetic memory device 113 according to the embodiment as shown in FIG. 4, a magnetic body 10A and a magnetic body 20A are provided in addition to the first magnetic body 10 and the second magnetic body 20. An insulating layer 15A is provided in the example. The first electrode 51, the second electrode 52, the controller 70, the third magnetic body 33, the fourth magnetic body 34, and the first intermediate layer 31n are further provided. These are similar to those of the magnetic memory device 110; and a description is omitted.

In the magnetic memory device 113, the magnetic body that has the tubular configuration is divided into the first magnetic body 10 and the magnetic body 10A. The other magnetic body is divided into the second magnetic body 20 and the magnetic body 20A. The insulating film Is divided into the insulating layer 15 and the insulating layer 15A. The configurations of the magnetic body 10A, the magnetic body 20A, and the insulating layer 15A are similar respectively to the configurations of the first magnetic body 10, the second magnetic body 20, and the Insulating layer 15.

In the magnetic memory device 113, the surface in the X-Y cross section (a cross section perpendicular to the first direction) of the first magnetic body 10 has an arc configuration. Thus, in the embodiment, at least a portion of the surface in the X-Y cross section of the first magnetic body 10 has, for example, an arc configuration.

The fifth magnetic body 35, the sixth magnetic body 36, and the second Intermediate layer 32n are provided in the magnetic memory device 113. The fifth magnetic body 35 is continuous with the magnetic body 10A. In the example, the fifth magnetic body 35 is continuous with a first end 10Ae of the magnetic body 10A. The second intermediate layer 32n is provided between the fifth magnetic body 35 and the sixth magnetic body 36. The sixth magnetic body 36 and the second intermediate layer 32n are used as the second recording/reproducing unit 32.

A third electrode 53 that is electrically connected to the magnetic body 10A is provided. The controller 70 is electrically connected to the third electrode 53.

The first magnetic body 10, the first electrode 51, and the second electrode 52 are included in one memory unit 81. The magnetic body 10A, the third electrode 53, and the second electrode 52 are included in another memory unit 82. In the example, the second electrode 52 is shared by the two memory units.

In the magnetic memory device 113 as well, the bit density can be increased.

(Second Embodiment)

Figures 5A, 5B:
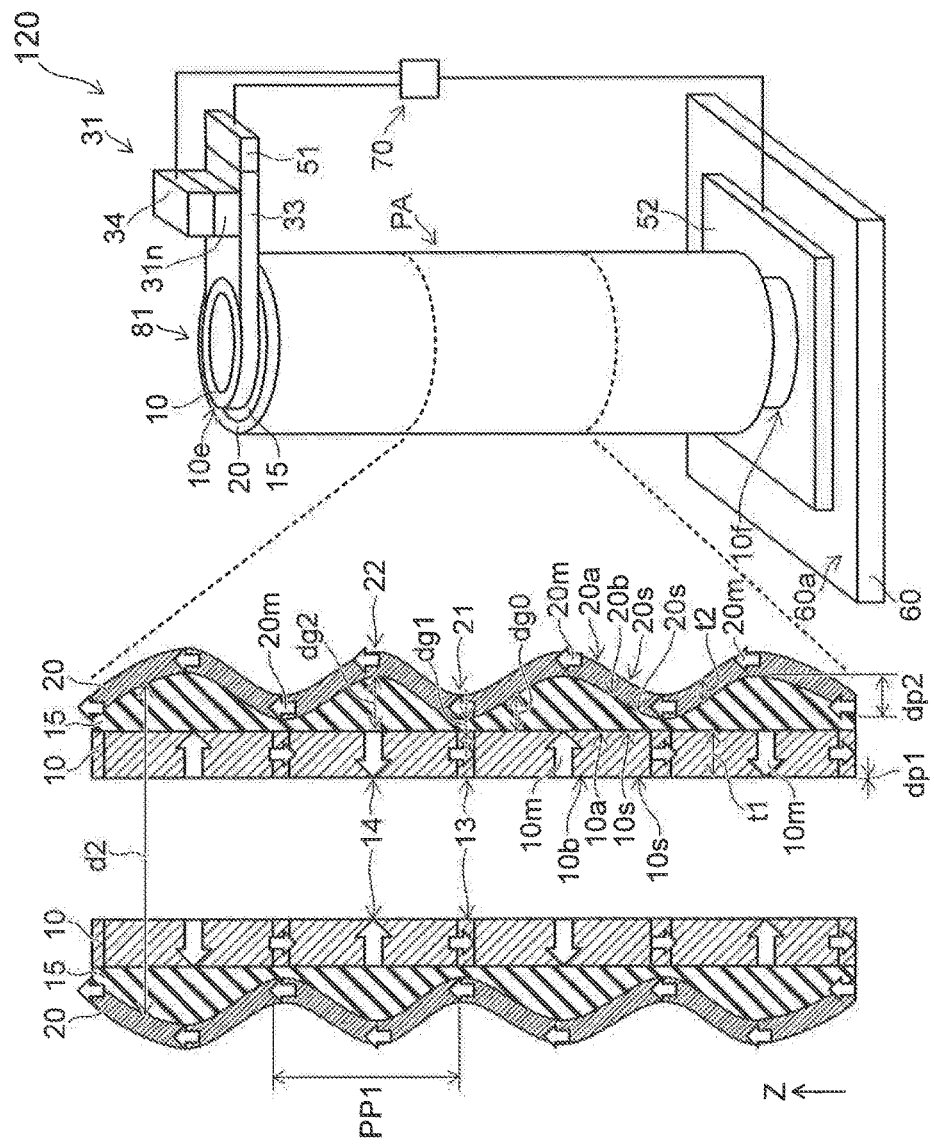
FIG. 5A and FIG. 5B are schematic views illustrating a magnetic memory device according to a second embodiment.

FIG. 5A and FIG. 5B are schematic views illustrating a magnetic memory device according to a second embodiment.

FIG. 5B is a perspective view. FIG. 5A is a cross-sectional view of a portion of FIG. 5B.

As shown in FIG. 5B, the magnetic memory device 120 according to the embodiment also Includes the first magnetic body 10 and the second magnetic body 20. The first magnetic body 10 and the second magnetic body 20 extend in the first direction. A description is omitted as appropriate for the portions of the magnetic memory device 120 that are similar to those of the magnetic memory device 110.

FIG. 5A is a cross-sectional view of a plane including the Z-axis direction. In the embodiment as well, the distance dg0 between the second magnetic body 20 and the first magnetic body 10 changes periodically along the Z-axis direction (the first direction).

In the example, the second magnetic body 20 is provided around the first magnetic body 10. In other words, the first magnetic body 10 has a tubular configuration extending in the first direction; and the second magnetic body 20 is provided around the first magnetic body 10. The diameter d2 (the inner diameter) of the second magnetic body 20 changes periodically along the first direction.

Thereby, the distance dg0 between the first magnetic body 10 and the second magnetic body 20 changes periodically. Modulation of the potential of the first magnetic body 10 is caused by the static magnetic field from the second magnetic body 20. Thereby, the stability of the movement of the domain walls of the first magnetic body 10 increases. For example, the stability of the movement of the magnetic domains of the first magnetic body 10 increases.

For example, the magnetic interaction between these magnetic bodies in the regions where the distance dg0 is short is utilized. In the magnetic memory device 120 as well, the bit density can be increased.

In the example as well, the first magnetic body 10 has the first side surface 10s. The first side surface 10s crosses the second direction that is perpendicular to the first direction. The first side surface 10s is the first outer side surface 10a or the first Inner side surface 10b. The fluctuation range (the first fluctuation range dp1) along the Z-axis direction (the first direction) of the position of the first side surface 10s in the second direction is small.

On the other hand, the second magnetic body 20 has second side surface 20s. The second side surface 20s crosses the second direction. The second side surface 20s is the second outer side surface 20a or the second inner side surface 20b. The fluctuation range (the second fluctuation range dp2) along the Z-axis direction (the first direction) of the position of the second side surface 20s in the second direction is large. The first fluctuation range dp1 is smaller than the second fluctuation range dp2.

In the magnetic memory device 120 as well, for example, the width (the length along the first direction) of the third region 13 is shorter than the width (the length along the first direction) of the fourth region 14.

The distance dg0 between the second magnetic body 20 and the first magnetic body 10 changes periodically along the first direction. The period pp1 is the period of the change of the distance dg0. In the magnetic memory device 120 as well, for example, the distance dg0 between the second magnetic body 20 and the first magnetic body 10 at the positions where the distance dg0 is short is smaller than the period pp1. The first distance dg1 is shorter than the second distance dg2. The first distance dg1 is shorter than the period pp1. The second magnetic body 20 can act effectively on the first magnetic body by setting the first distance dg1 to be sufficiently smaller than the period pp1.

In the magnetic memory device 120, the first distance dg1 Is, for example, ⅕ of the period pp1 or less. The first distance dg1 may be, for example, ¹⁄₁₀ of the period pp1 or less. High controllability of the domain walls (the magnetic domains) is obtained.

In the magnetic memory device 120, the second distance dg2 is 2 times the first distance dg1 or more. The second distance dg2 may be 4 times the first distance dg1 or more. High controllability of the domain walls (the magnetic domains) is obtained.

An example of the method for manufacturing the magnetic memory device 120 will now be described.

FIG. 6A to FIG. 6F are schematic cross-sectional views in order of the processes, Illustrating the method for manufacturing the magnetic memory device according to the second embodiment.

Figure 6A:
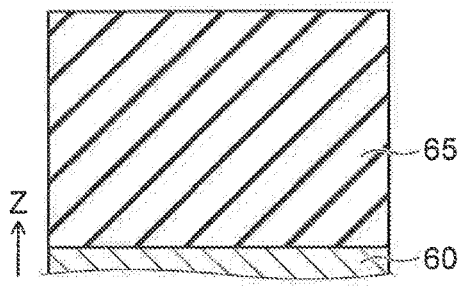
FIG. 6A to FIG. 6F are schematic cross-sectional views in order of the processes, illustrating the method for manufacturing the magnetic memory device according to the second embodiment.

As shown in FIG. 6A, the foundation layer 65 is formed on the substrate 60. For example, the foundation layer 65 is nonmagnetic.

Figure 6B:
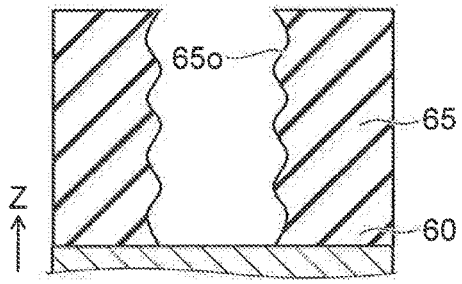

As shown in FIG. 6B, the hole 65o is formed in the foundation layer 65. The direction in which the hole 65O extends corresponds to the Z-axis direction. The diameter of the hole 65o changes periodically along the Z-axis direction. The method described in reference to the method for forming the hole 15o in FIG. 2E, etc., can be utilized in the formation of such a hole 65o.

Figure 6C:
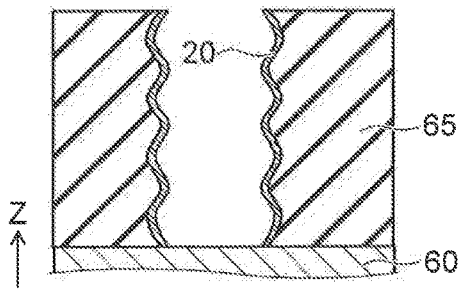

As shown in FIG. 6C, a magnetic film that is used to form the second magnetic body 20 is formed on the inner wall of the hole 65O. The second magnetic body 20 has a tubular configuration. The diameter of the second magnetic body 20 changes periodically along the Z-axis direction.

Figure 6D:
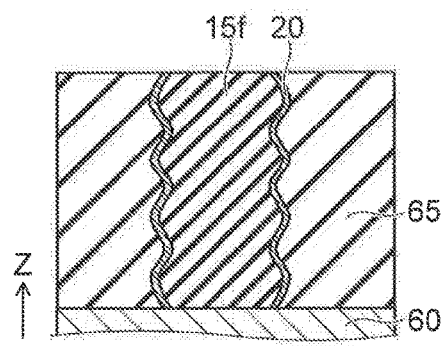

As shown in FIG. 6D, the film 15f is formed in the remaining space of the hole 65O.

Figure 6E:
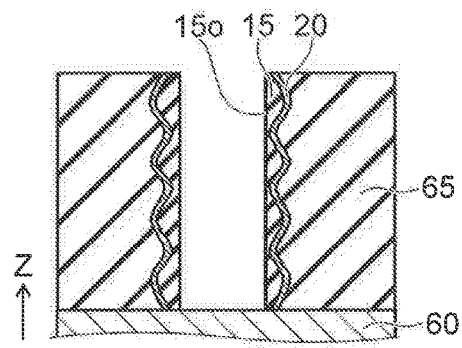

As shown in FIG. 6E, the hole 15o is formed in the film 15f. Thereby, the Insulating layer 15 is formed.

Figure 6F:
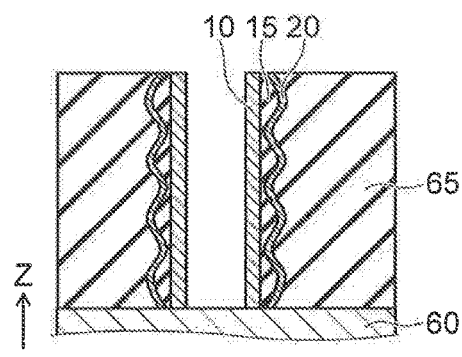

As shown in FIG. 6F, a magnetic film that is used to form the first magnetic body 10 is formed on the surface of the hole 15o. The first magnetic body 10 extends in the Z-axis direction.

In the formation of the first magnetic body 10 recited above, for example, a perpendicular magnetization metal film is obtained by forming a stacked film of a Pt film and a Co film. For example, the stacked film is formed by CVD. The perpendicular magnetization metal film is used to form the first magnetic body 10.

In the formation of the second magnetic body 20 recited above, for example, an in-plane magnetization film is obtained by forming a Co film. For example, the Co film is formed by CVD. The in-plane magnetization film is used to form the second magnetic body 20.

The first electrode 51, the second electrode 52, the third magnetic body 33, the fourth magnetic body 34, and the first intermediate layer 31n are appropriately formed. Thereby, the magnetic memory device 120 is obtained.

In the magnetic memory device 120 as well, the fifth magnetic body 35, the sixth magnetic body 36, and the second intermediate layer 32n may be provided similarly to the magnetic memory devices 111 and 112.

In the magnetic memory device 120 as well, the magnetic bodies may be divided along the first direction similarly to the magnetic memory device 113. In other words, the magnetic body 10A, the magnetic body 20A, and the Insulating layer 15A may be provided in addition to the first magnetic body 10, the second magnetic body 20, and the insulating layer 15.

(Third Embodiment)

Figure 7:
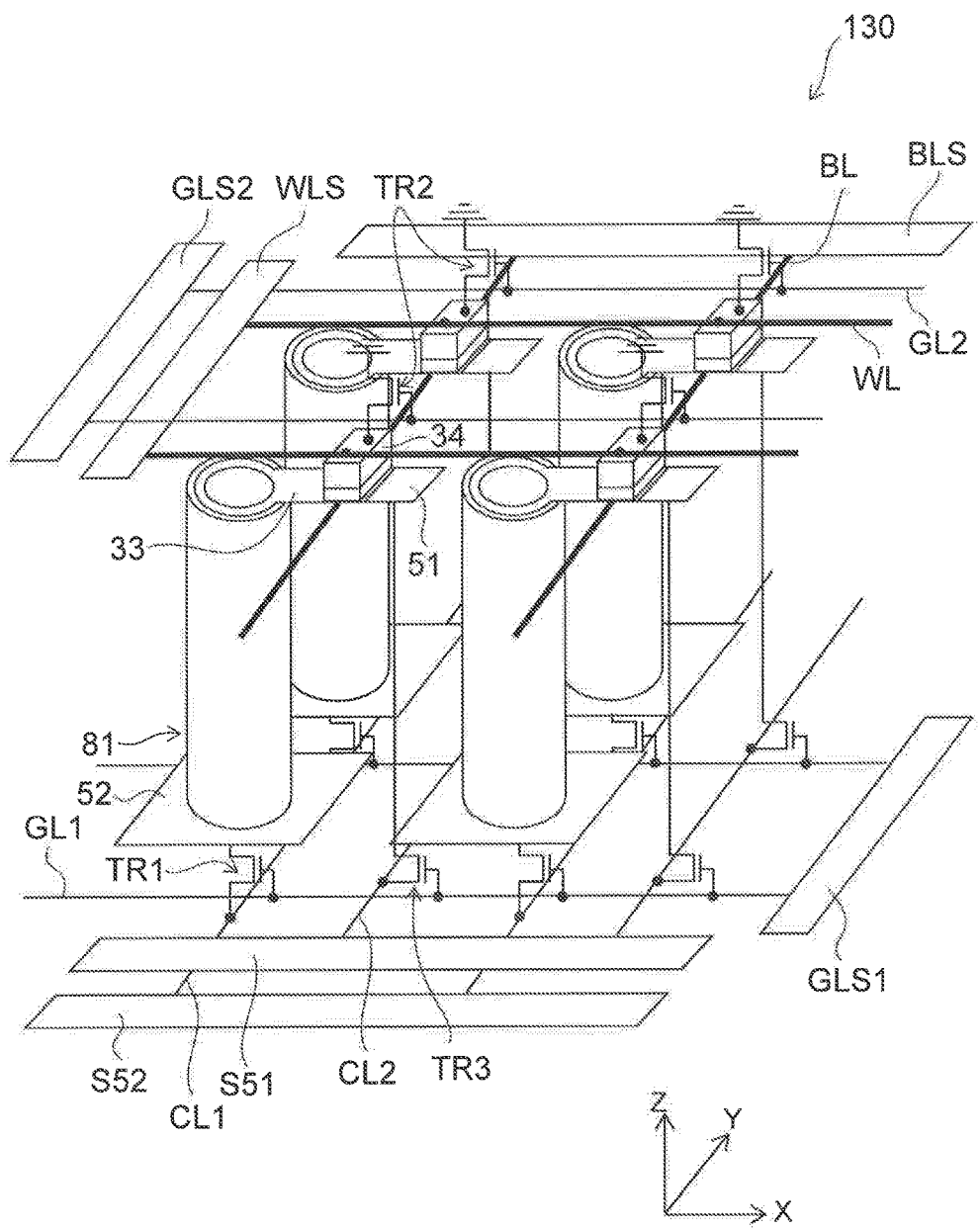
FIG. 7 is a schematic view illustrating a magnetic memory device according to a third embodiment.

FIG. 7 is a schematic view illustrating a magnetic memory device according to a third embodiment.

As shown in FIG. 7, the magnetic memory device 130 according to the embodiment includes the multiple memory units 81. For example, the memory units 81 have the configurations described in the first and second embodiments. For example, in the magnetic memory device 130, the multiple memory units 81 are arranged in an array configuration along the X-axis direction and the Y-axis direction.

A first common gate line selector GLS1, a second electrode selector S52, a first electrode selector S51, a bit line selector BLS, a word line selector WLS, and a second common gate line selector GLS2 are provided in the magnetic memory device 130.

The first common gate line selector GLS1 is connected to multiple first common gate lines GL1. For example, the first common gate lines GL1 extend in the X-axis direction.

The second electrode selector S52 is connected to multiple first common interconnects CL1. For example, the first common interconnects CL1 extend in the Y-axis direction.

The first electrode selector S51 is connected to multiple second common interconnects CL2. For example, the second common interconnects CL2 extend in the Y-axis direction.

The bit line selector BLS is connected to multiple bit lines BL. For example, the bit lines BL extend in the Y-axis direction.

The word line selector WLS is connected to multiple word lines WL. For example, the word lines WL extend in the X-axis direction.

The second common gate line selector GLS2 is connected to multiple second common gate lines GL2. For example, the second common gate lines GL2 extend in the X-axis direction.

Multiple first transistors TR1, multiple second transistors TR2, and multiple third transistors TR3 are provided in the magnetic memory device 130.

For example, the first transistors TR1 and the third transistors TR3 are provided under the multiple memory units 81. The second transistors TR2 are provided on the multiple memory units 81.

The gate of the first transistor TR1 is connected to the first common gate line GL1. One terminal other than the gate of the first transistor TR1 is connected to the first common interconnect CL1. Another terminal other than the gate of the first transistor TR1 is connected to the second electrode 52 of one memory unit 81.

The gate of the second transistor TR2 is connected to the second common gate line GL2. One terminal other than the gate of the second transistor TR2 is connected to the fourth magnetic body 34 of one memory unit 81. Another terminal other than the gate of the second transistor TR2 is connected to a fixed potential (e.g., the ground potential).

The gate of the third transistor TR3 is connected to the first common gate line GL1. One terminal other than the gate of the third transistor TR3 is connected to the second common interconnect CL2. Another terminal other than the gate of the third transistor TR3 is connected to the first electrode 51.

The recording and the reproducing of the information to and from the multiple memory units 81 is performed by the transistors and the selectors recited above.

A magnetic wire is provided in a domain wall memory. The recording and reproducing of the information and the shift operation of the domain walls of the magnetic wire are performed based on the magnetization of the magnetic wire. The domain wall memory is a shift register memory. In such a magnetic memory device, a high-aspect magnetic wire formed of a perpendicular magnetization film is used to increase the capacity. For example, the magnetic wire of the perpendicular magnetization film has a hollow tube configuration. In the magnetic wire, for example, the easy magnetization axis is the diametrical direction. In the memory operations, high stability is necessary for the movement of the domain walls inside the magnetic wire of the perpendicular magnetization film. According to the embodiment, the stability of the movement of the domain walls can be improved. Thereby, a high bit density is obtained.

In the embodiment, the second magnetic body 20 is provided on the Inner side or the outer side of the domain wall movement layer (the first magnetic body 10) of the simple tube-type perpendicular magnetization film. The insulating layer 15 is provided between the domain wall movement layer and the second magnetic body 20. The diameter of the insulating layer 15 changes periodically along the length direction of the tube. The diameter is at least one of the inner diameter or the outer diameter. The second magnetic body 20 has a magnetization oriented in the length direction of the tube. By such a configuration, potential modulation caused by the static magnetic field from the second magnetic body 20 occurs. Thereby, the pinning of the domain walls in the domain wall movement layer Is controlled. Thereby, the stability of the movement of the domain walls increases.

According to the embodiments, a magnetic memory device can be provided in which the bit density can be increased. According to the embodiments, a magnetic memory device can be provided in which the operation stability can be Improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the Invention by appropriately selecting specific configurations of components included in magnetic memory devices, such as first magnetic bodies, second magnetic bodies, insulating layers, third to sixth magnetic bodies, electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first magnetic body extending in a first direction; and
a second magnetic body extending in the first direction,
a distance between the second magnetic body and the first magnetic body changing periodically along the first direction,
wherein the first magnetic body has a tubular configuration extending in the first direction to surround a periphery of the second magnetic body.

2. The device according to claim 1, wherein the second magnetic body has a tubular configuration extending in the first direction.

3. The device according to claim 2, wherein a diameter of the second magnetic body changes periodically along the first direction.

4. The device according to claim 1, wherein
the first magnetic body includes an alloy including a first element and at least one of Co or Fe, and
the first element includes at least one of Ni, Pt, Ph, Pd, Gd, Tb, Dy, Ho, Er, Tm, Yb, Lu, O, B, Ga, Ge, Si, Al, Mn, Mg, Zr, or Hf.

5. The device according to claim 1, wherein
the first magnetic body includes:
a first film including at least one of Co or Fe; and
a second film stacked with the first film, the second film including a first element, and
the first element includes at least one of Ni, Pt, Ph, Pd, Gd, Tb, Dy, Ho, Er, Tm, Yb, Lu, O, B, Ga, Ge, Si, Al, Mn, Mg, Zr, or Hf.

6. The device according to claim 1, wherein at least a portion of a surface in a cross section of the first magnetic body perpendicular to the first direction has an arc configuration.

7. A magnetic memory device, comprising:
a first magnetic body extending in a first direction; and
a second magnetic body extending in the first direction, a distance between the second magnetic body and the first magnetic body changing periodically along the first direction, wherein the first magnetic body has a first side surface crossing a second direction, the second direction being perpendicular to the first direction, the second magnetic body has a second side surface crossing the second direction, and a first fluctuation range along the first direction of a position of the first side surface in the second direction is smaller than a second fluctuation range along the first direction of a position of the second side surface in the second direction.

8. A magnetic memory device, comprising:

a first magnetic body extending in a first direction; and a second magnetic body extending in the first direction, a distance between the second magnetic body and the first magnetic body changing periodically along the first direction, wherein the second magnetic body includes a first region and a second region, a position of the second region in the first direction is different from a position of the first region in the first direction, a first distance along a second direction between the first region and the first magnetic body is shorter than a second distance along the second direction between the second region and the first magnetic body, the second direction being perpendicular to the first direction, and the first distance is shorter than a period of the change of the distance between the second magnetic body and the first magnetic body.

9. The device according to claim 8, wherein the first distance is not more than ⅕ times the period.

10. The device according to claim 8, wherein the second distance is not less than twice the first distance.

11. A magnetic memory device, comprising:

a first magnetic body extending in a first direction;

a second magnetic body extending in the first direction, a first electrode; and a second electrode, a distance between the second magnetic body and the first magnetic body changing periodically along the first direction, the first magnetic body being conductive, the first magnetic body having a first end and a second end, the second end being arranged with the first end in the first direction, the first electrode being electrically connected to the first end, the second electrode being electrically connected to the second end.

12. The device according to claim 11, further comprising a controller electrically connected to the first electrode and the second electrode, the controller supplying a current to the first magnetic body via the first electrode and the second electrode.

13. The device according to claim 11, further comprising:

a third magnetic body continuous with the first magnetic body;

a fourth magnetic body; and a first intermediate layer provided between the third magnetic body and the fourth magnetic body.

14. The device according to claim 13, wherein the third magnetic body includes a portion not overlapping the first magnetic body in the first direction, and the fourth magnetic body does not overlap the first magnetic body in the first direction.

15. The device according to claim 13, further comprising:

a fifth magnetic body continuous with the first magnetic body;

a sixth magnetic body; and a second intermediate layer provided between the fifth magnetic body and the sixth magnetic body.

16. A magnetic memory device, comprising:

a first magnetic body extending in a first direction; and a second magnetic body extending in the first direction, a distance between the second magnetic body and the first magnetic body changing periodically along the first direction, the first magnetic body has an easy magnetization axis along a direction crossing the first direction, and the second magnetic body has an easy magnetization axis having a component along the first direction.

* * * * *